United States Patent [19]

Voss

[11] Patent Number: 5,065,211
[45] Date of Patent: Nov. 12, 1991

[54] THYRISTOR HAVING CATHODE SHORTS

[75] Inventor: Peter Voss, Munich, Fed. Rep. of Germany

[73] Assignee: Eupec Europaeisch Gesellsch F. Leistungshalbleiter mbH & Co.KG, Fed. Rep. of Germany

[21] Appl. No.: 630,033

[22] Filed: Dec. 19, 1990

[30] Foreign Application Priority Data

Dec. 19, 1989 [EP] European Pat. Off. ........ 89123497.3

[51] Int. Cl.$^5$ .............................................. H01L 29/74
[52] U.S. Cl. ....................................... 357/38; 357/86; 357/89; 357/90
[58] Field of Search ........................ 357/38, 86, 89, 90

[56] References Cited

U.S. PATENT DOCUMENTS 5,001,537  3/1991  Colman et al. ....................... 351/38

Primary Examiner—Edward J. Wojciechowicz
Attorney, Agent, or Firm—Hill, Van Santen, Steadman & Simpson

[57] ABSTRACT

In order to improve the dynamic properties of thyristors, it can be desirable to lower the storage charge in the proximity of the emitter. This can be achieved in that the emitter efficiency is deteriorated by shorts given high currrent density. At the cathode side, the shorts are constructed such that highly-doped short-circuit regions are arranged in the emitter zone. The short-circuit regions are overlapped by intermediate regions that have the same type of conductivity as that of the emitter zone. That area not overlapped is significantly smaller than the area of the short-circuit region. The short-circuiting area is therefore small given low current density and is large given high current density. Similar shorts can also be employed at the anode side.

2 Claims, 2 Drawing Sheets

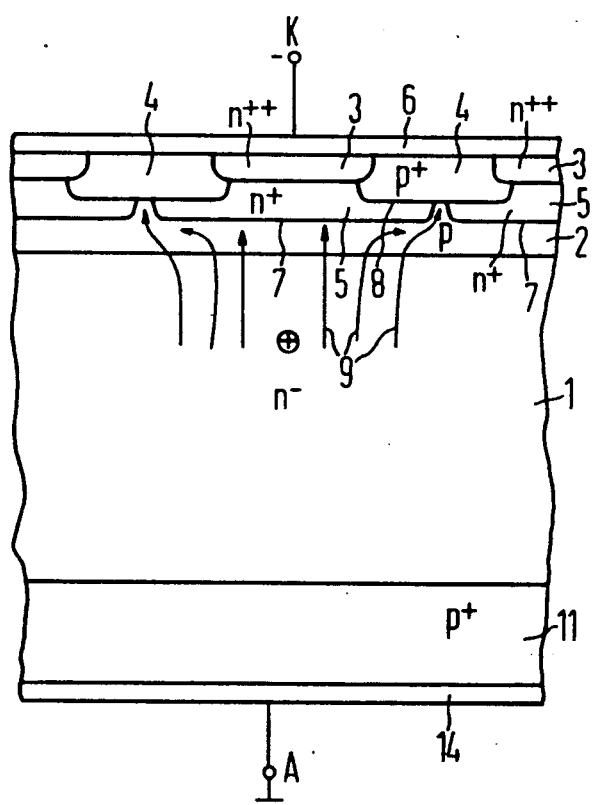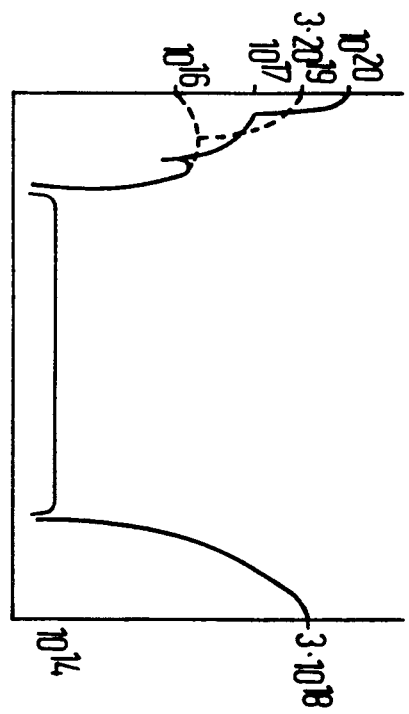

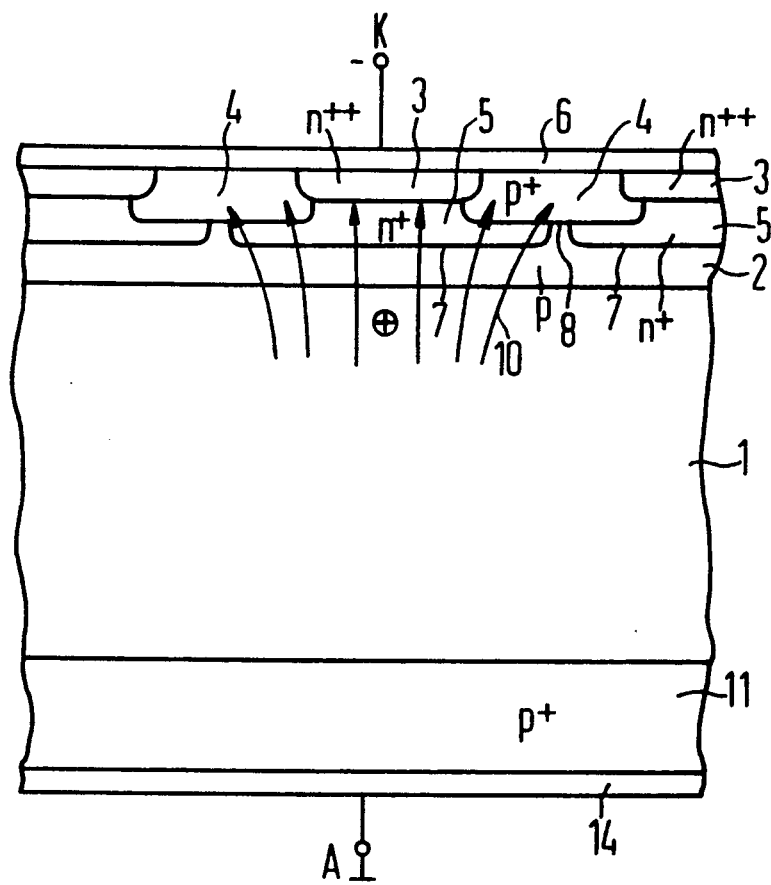

THYRISTOR HAVING CATHODE SHORTS

BACKGROUND OF THE INVENTION

1. Field of the Invention

The present invention relates to a thyristor comprising a semiconductor body having at least one emitter zone of a first conductivity type adjoining the cathode-side surface, a base zone of an opposite, second conductivity type at the cathode side, and a cathode electrode that shorts the base zone and the emitter zone.

2. Description of the Prior Art

Thyristors of the type generally set forth above are well known in the art. The shorts in such thyristors are generally arranged at the cathode side. The efficiency of the emitter at the cathode side is therefore reduced. The shorts generally occupy a small area, measured relative to the thyristor area, in order to keep the trigger current low and in order to assure the propagation of the trigger event. These small-area shorts are practically unnoticeable given a higher current density when completely flooded by charge carriers.

In view of favorable dynamic properties of the thyristor in some applications, for example in power converters and choppers, it can be desirable to reduce the emitter efficiency at the cathode side or at the cathode side and the anode side into the region of high current density. This means relatively large-area short-circuit regions that would have a disadvantageous effect in the range of low current density, for example for the trigger propagation.

SUMMARY OF THE INVENTION

The object of the present invention is to provide an improved thyristor of the type generally set forth above having shorts between the cathode-side base zone and the cathode-side emitter zone such that the shorts do not impede the trigger propagation given low current density and such that they favorably influence the dynamic properties of the thyristor given high current density.

The above object is achieved, according to the present invention in a thyristor comprising a semiconductor body, having at least one emitter zone of a first conductivity type adjoining the cathode-side surface, a base zone of an opposite, second conductivity type at the cathode side, and a cathode electrode that shorts the base zone and the emitter zone such that the shorts do not impede the trigger propagation given low current density and such that they favorably influence the dynamic properties of the thyristor given high current density, the object being achieved by the features:

(a) Short-circuit regions of the second conductivity type are arranged in the emitter zone, these short-circuit regions adjoining the surface of the semiconductor body and having a higher doping concentration than that of the base zone;

(b) At least one intermediate zone of the first conductivity type is arranged between the base zone and the emitter zone, this intermediate zone having a lower doping concentration that of the emitter zone and a higher doping concentration than that of the base zone;

(c) The intermediate zone has a larger area than that of the emitter zone and overlaps each of the short-circuit regions; and (d) The area of each of the short-circuit regions not overlapped by the intermediate zone is significantly smaller than the area of these short-circuit regions.

According to another feature of the invention, the above thyristor is particularly characterized in that the short-circuit regions have a greater thickness than that of the emitter zone.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a fragmentary sectional view through a thyristor constructed in accordance with the present invention and showing the path of the current given low current density;

FIG. 2 is a graphic illustration of the doping concentration of different zones of the thyristor of FIG. 1; and FIG. 3 is a fragmentary sectional view of the thyristor of FIG. 1 showing the path of the current given high current density.

DESCRIPTION OF THE PREFERRED EMBODIMENTS

Referring to FIG. 1, a thyristor is illustrated as having a lightly n-doped middle zone 1 and a more highly p-doped, cathode-side base zone 2. A highly n-doped emitter zone 3 is embedded in the base zone 2. The emitter zone has recesses in which highly p-doped short-circuit regions 4 are arranged. These short-circuit regions can have approximately the same depth as the emitter zone 3; however, they can also be fashioned thicker. An n-doped intermediate zone 5 is arranged between the base zone 2 and the emitter zone 3. This intermediate zone 5 has a higher doping concentration than that of the base zone 2 and is considered to be an n+ zone, but a lower doping concentration than that of the emitter zone 3. A plurality of pn junctions 8 lie between the short-circuit regions 4 and the adjacent intermediate zones 5.

The intermediate zone 5 overlaps the short-circuit regions 4 such that the non-overlapped area of the short-circuit regions 4, as illustrated, is small in comparison to the overall area of the short-circuit regions. The intermediate zone 5 can occupy an area of at least 90% of the cathode area of the thyristor, for example 98%. The area of the short-circuit regions 4 can have an area between 10% and 70% of the cathode-side area of the thyristor. The emitter zone 3 and the short-circuit regions 4 are contacted in common by a cathode electrode 6.

The edge doping of the zones 3, 4, 5 and 2, for example, can amount to $10^{20}$, $3 \times 10^{18}$, $10^{17}$ and $10^{16}$, respectively, (see FIG. 2). A zone sequence having an inverse doping is possible.

The path of the positive charge carriers given a cathode that is negative in comparison to the anode is entered in FIG. 1 for low current density. Electrons are emitted from the n+ zone 5 as soon as the quadrature-axis component of the voltage under this zone reaches approximately 0.5 volts. Since the area of the short-circuit regions 4 that is not overlapped by the intermediate n+ zone 5 is small, as pointed out above, the short effect is slight and, consequently, a low value for the ignition current is set. The propagation of the plasma, moreover, is only slightly impeded. On the other hand, the short-circuit effect is strong enough in order to prevent a du/dt ignition.

At higher current density, the positive charge carriers follow a path that is symbolized by the arrows 10 in FIG. 3. The pn junctions 8 between the short-circuit p regions 4 and the intermediate n+ zone 5 are thereby also flooded by charge carriers. A major portion of the positive charge carriers can therefore now flow off through the overlapping area of the intermediate n+ zone 5 to the short-circuit p regions 4. The shorting area in this case has therefore increased to 10–70% of the cathode area of the thyristor in accordance with the above-recited dimensions for the area of the short-circuit regions.

The storage charge at the cathode side can be significantly lowered with this measure, so that only a few charge carriers are present at the very outset in the proximity of the blocking pn junction. Shorts that are slightly modified in comparison to the above-described shorts of the cathode side can also be arranged at the anode side of the thyristor. The storage charge at the anode side can also be reduced with the additional shorts at the anode side.

The present invention has been set forth with reference to an exemplary embodiment wherein a single cathode-side or, respectively, anode-side emitter zone, a plurality of short-circuit regions and a respective intermediate zone for each are provided. However, many emitter zones can also be provided, for example in the form of strips. Only a single, interconnected short-circuit region is then respectively present. Corresponding to the emitter zones, the intermediate zone is then likewise fashioned in the form of a plurality of strips.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor of the type comprising a semiconductor body, at least one emitter zone of a first conductivity type adjoining a cathode-side surface, a base zone of an opposite, second conductivity type at the cathode side of the thyristor, and a cathode electrode which shorts the base zone and the emitter zone, the improvement therein comprising:

short-circuit regions of the second conductivity type arranged in the emitter zone, said short-circuit regions adjoining the surface of the semiconductor body and having a higher doping concentration than that of the base zone;

at least one intermediate zone of the first conductivity type arranged between the base zone and the emitter zone, said intermediate zone having a lower doping concentration than that of the emitter zone and a higher doping concentration than that of the base zone;

said intermediate zone having a larger area than the emitter zone and overlapping each of said short-circuit regions; and the area of each of said short-circuit regions not overlapped by said intermediate zone being significantly smaller than the area of said short-circuit regions.

2. The improved thyristor of claim 1, wherein:

the emitter zone comprises a predetermined thickness; and said short-circuit regions comprise a greater thickness than the predetermined thickness of the emitter zone.

* * * * *